United States Patent
Wei et al.

(10) Patent No.: US 9,548,747 B2
(45) Date of Patent: Jan. 17, 2017

(54) GLITCH-FREE DIGITALLY CONTROLLED OSCILLATOR CODE UPDATE

(71) Applicant: Intel Corporation, Santa Clara, CA (US)

(72) Inventors: Fangxing Wei, Folsom, CA (US); Michael J. Allen, Folsom, CA (US); Setul M. Shah, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/713,174

(22) Filed: May 15, 2015

(65) Prior Publication Data
US 2016/0336943 A1 Nov. 17, 2016

(51) Int. Cl.
H03L 7/085 (2006.01)
H03L 7/099 (2006.01)
H03L 7/095 (2006.01)
H03L 7/087 (2006.01)

(52) U.S. Cl.
CPC ............. *H03L 7/0991* (2013.01); *H03L 7/087* (2013.01); *H03L 7/095* (2013.01); *H03L 2207/50* (2013.01)

(58) Field of Classification Search
CPC ............................. H03L 2207/50; H03L 7/087
USPC ............................ 331/1 A, 57; 327/156, 159
See application file for complete search history.

(56) References Cited

U.S. PATENT DOCUMENTS

| 8,598,929 | B1 | 12/2013 | Wicpalek et al. |
| 2010/0090769 | A1 | 4/2010 | Lee et al. |
| 2011/0182390 | A1 | 7/2011 | Lin et al. |
| 2013/0113530 | A1 | 5/2013 | Saint-Laurent |
| 2013/0307631 | A1* | 11/2013 | Lotfy .................. H03K 3/0315 331/34 |
| 2015/0002505 | A1 | 1/2015 | Vandepas |

OTHER PUBLICATIONS

International Search Report and Written Opinion issued in PCT Application No. PCT/US2016/027258, dated Jul. 20, 2016.

* cited by examiner

*Primary Examiner* — Arnold Kinkead
(74) *Attorney, Agent, or Firm* — Grossman, Tucker, Perreault & Pfleger, PLLC

(57) ABSTRACT

A glitch-free digitally controlled oscillator (DCO) code update may be achieved by synchronizing the transfer of the DCO code update to a logic state transition of a pulse in the DCO clock output signal such that the code update may be achieved while the DCO delay chain remains in the same logic state. A state machine may provide the DCO code update and a pulsed update signal to a timing circuit. The DCO code update may be aligned with a pulse in the pulsed update signal. The timing circuit may generate a DCO code update enabled signal upon alignment of the pulse in the pulsed update signal with a state transition of a pulse in the pulsed DCO clock output. The DCO code update enabled signal may be aligned with a state transition in the pulsed DCO clock output to permit a glitch-free DCO code update.

20 Claims, 5 Drawing Sheets

GLITCH-FREE DIGITALLY CONTROLLED OSCILLATOR CODE UPDATE

TECHNICAL FIELD

The present disclosure relates to providing code updates to digital controlled oscillators.

BACKGROUND

Clock frequencies and data transfer rates continue to increase in many microprocessor based devices. In the past, analog phase-locked loop (PLL) circuits were frequently employed for frequency synthesis, clocking, and data transfer. With a growing trend toward smaller, portable microprocessor based devices the relatively high power draw of PLL circuitry proved detrimental. Digitally controlled PLLs provide a generally more robust construction, consumer less power than analog PLLs, and require less real estate on increasingly packed integrated circuits. Within a digitally controlled PLL, a digitally controlled oscillator (DCO) replaces the voltage controlled oscillator (VCO) found in earlier analog PLL systems. Similar to their analog counterpart, changes within the system (e.g., temperature changes, voltage changes, changes in component resistance or impedance, and similar) may cause the output provided by a digitally controlled oscillator to drift over time. To correct such drift, a state machine may provide DCO code updates to tune the output of the DCO based on current system parameters. Typically, these code updates are provided by the state machine without synchronization to the clocking of the DCO itself. Such asynchronous updates may occur at times when the DCO delay chain has different logic states at the switching points, increasing the possibility of transient glitches in the DCO clock output. Such glitches in the DCO clock output may lead to unfavorable system behaviors such as limiting the ability to tune a clock generator during memory operations.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
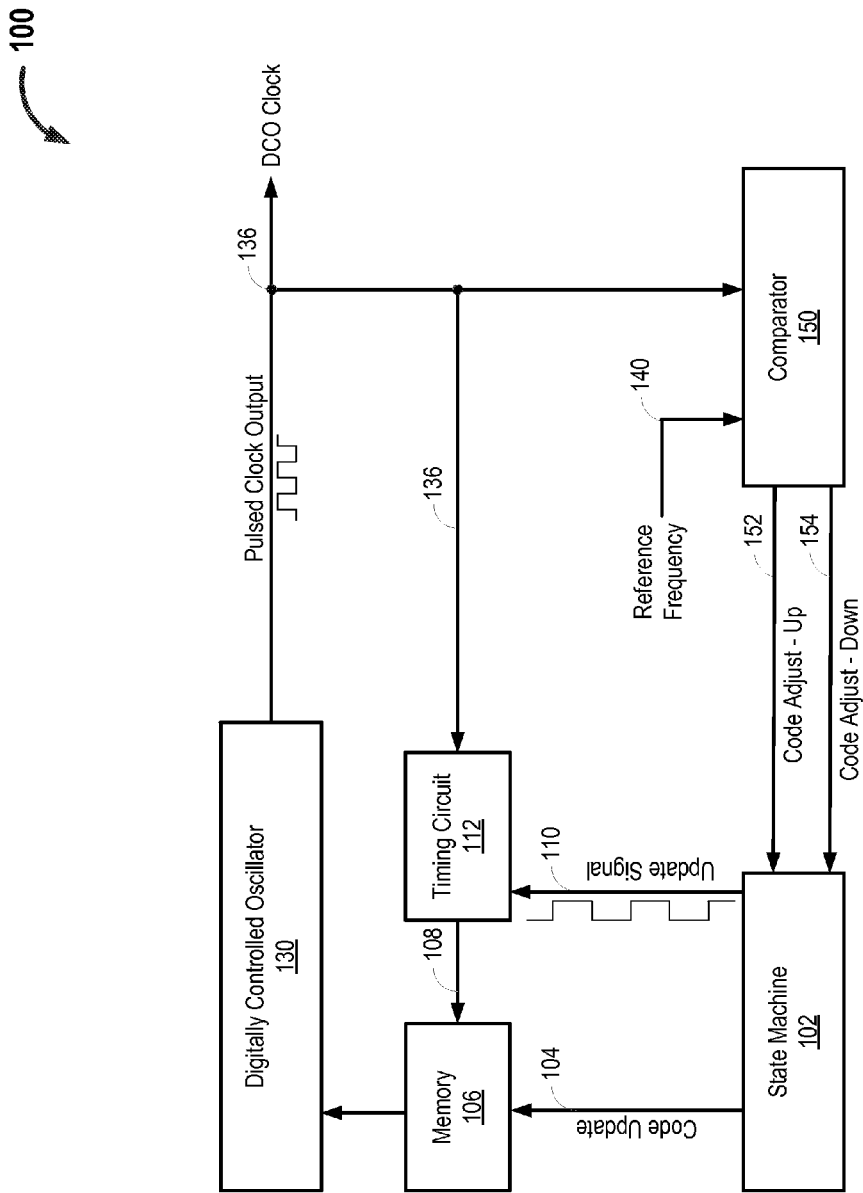
FIG. 1 illustrates an example system that includes at least a state machine and a timing circuit capable of providing a glitch-free digitally controlled oscillator (DCO) code update, in accordance with at least one embodiment of the present disclosure.

Although the following Detailed Description will proceed with reference being made to illustrative embodiments, many alternatives, modifications and variations thereof will be apparent to those skilled in the art.

DETAILED DESCRIPTION

Synchronizing a digitally controlled oscillator code update to an instant or interval when the DCO delay chain is in the same logic state reduces the likelihood of a timing glitch in the DCO clock output signal. The DCO clock output signal is made up of a series of pulses occurring at a defined frequency. Each of the pulses in the DCO clock output signal includes a leading edge indicative of a change from a first logic state (e.g., a LOW logic state) to a second logic state (e.g., a HIGH logic state) and a trailing edge indicative of a return to the first logic state from the second logic state. The DCO code update can be applied contemporaneous with the transition of the DCO clock output between logic states when the DCO delay chain is in the same logic state. In other words, the DCO code update may be applied contemporaneous with the leading edge of a DCO clock pulse or the trailing edge of the DCO clock pulse. If the DCO code update concludes prior to one half of the DCO clock period less a total fine delay value, all of the switching points of the DCO delay chain will be in the same logic state. Such a DCO code update will not cause a glitch in the DCO clock output.

Included are illustrative systems for synchronizing DCO code updates with a clock output signal provided by a DCO to provide a glitch-free DCO clock output. The system may include at least one storage device to receive a DCO code update and transfer the DCO code update to at least one communicably coupled DCO. The system may additionally include at least one timing circuit communicably coupled to the at least one storage device. The at least one timing circuit also receives a pulsed clock output signal provided by the DCO. The at least one timing circuit aligns a logic state transition in a pulse in the pulsed DCO clock output with a logic state transition of a pulse in a pulsed update signal received, along with the DCO code update, from the state machine. The timing circuit generates a DCO update enabled signal that includes at least one pulse which, upon receipt by the at least one storage device, causes the transfer of the DCO code update from the at least one storage device to the DCO. The at least one pulse that causes the transfer of the DCO code update from the at least one storage device to the DCO is aligned with at least one of the leading edge of a pulse in the DCO clock output signal or the trailing edge of a pulse in the DCO clock output signal. By transferring the DCO code update when the DCO delay chain is in the same logic state, a glitch-free update of the DCO code may be accomplished.

Also included are illustrative methods for synchronizing digitally controlled oscillator (DCO) code updates with a clock output signal provided by a DCO to produce a glitch-free DCO clock output. The method includes generating, by a state machine, a pulsed update signal using a state machine. The pulsed update signal includes at least one pulse having a width that is at least equal to a period of a pulsed DCO clock output signal. The method also includes aligning, by the state machine, the DCO code update with a logic state transition of the pulse in the pulsed update signal. The method includes writing, storing or otherwise retaining the DCO code update in a memory communicably coupled to the state machine. The method includes synchronizing, by a timing circuit, a logic state transition of a pulse in a pulsed DCO clock output signal with the logic state transition of the pulse in the pulsed update signal. The method also includes transferring the DCO code update from the memory to a delay buffer in the DCO responsive to the synchronization of the logic state transition of a pulse in the pulsed DCO clock output signal with the logic state transition of the pulse in the pulsed update signal.

FIG. 1 illustrates an example glitch-free DCO update system 100 in which a code update 104 transferred to a memory 106 by a state machine 102 is used to glitch-free update a clock output 136 of the DCO, in accordance with one or more aspects of the present disclosure. The state machine 102 synchronizes the code update 104 to a pulsed update signal 110. A timing circuit 112 synchronizes the update signal 110 with the DCO pulsed clock output 136 to provide an update enabled signal 108 to the memory 106 which causes the memory 106 to transfer the code update 104 to the DCO 130. In embodiments the timing circuit synchronizes a state transition (e.g., a LOW/HIGH transition or a HIGH/LOW transition) in the pulsed update signal 110 with a logic state transition (e.g., a LOW/HIGH transition or a HIGH/LOW transition) in the pulsed DCO clock signal 136 to generate the DCO update enabled signal 108. The alignment or synchronization of at least one logic state transition in the DCO clock output signal 136 with the transfer of the code update 104 from the memory 106 to the DCO 130 provides a glitch-free DCO clock signal 136 throughout the DCO code update process.

In operation, the frequency of the DCO pulsed clock output 136 will drift over time as a process voltage temperature fluctuates. The state machine 102 periodically, aperiodically, or intermittently supplies a DCO code update 104 to the DCO 130 to correct the frequency drift in the DCO pulsed clock output 136 to maintain the frequency of the DCO pulsed clock output within an acceptable frequency range or band.

The comparator 150 detects changes, fluctuations, or deviations in the DCO pulsed clock output 136. In implementations, the comparator 150 can compare the DCO pulsed clock output with a stable or known reference frequency 140. Dependent at least in part on the deviation of the DCO pulsed clock output 136, the comparator 150 may provide a code adjust UP signal 152 or a code adjust DOWN signal 154 to the state machine 102. Responsive to receipt of the code adjust UP signal 152 or the code adjust down signal 154, the state machine 102 generates the DCO code update 104 and synchronizes the DCO code update 104 with the pulsed update signal 110.

The state machine 102 includes any number of devices, components, systems, or combinations thereof capable of providing the code update 104 and the pulsed update signal 110. The state machine 102 can write, store, transfer or otherwise provide the code update 104 to memory 106. After transfer from the state machine 102, the code update 104 may remain in the memory 106 until transferred to the DCO 130. The generation of the code update 104 by the state machine 102 may provide as a flag, handshake, or similar alert to the DCO 130 that a change in DCO pulsed clock output signal frequency is needed.

Memory 106 includes any number of devices, components, systems, or combinations thereof capable of transient storage or retention of the code update 104 communicated by the state machine 102. In embodiments, the memory 106 may include any number or combination of storage devices, such as a number of latches, capable of transient storage or retention of at least one of the code update 104 prior to communicating the code update 104 to the DCO 130. In one embodiment, the memory 106 may include a number of gated D-type latches that are clocked or enabled using the update enabled signal 108. In such instances, the memory 106 may communicate the DCO code updates 104 upon receipt of the update enabled signal 108 from the timing circuit 112.

Figure 2:
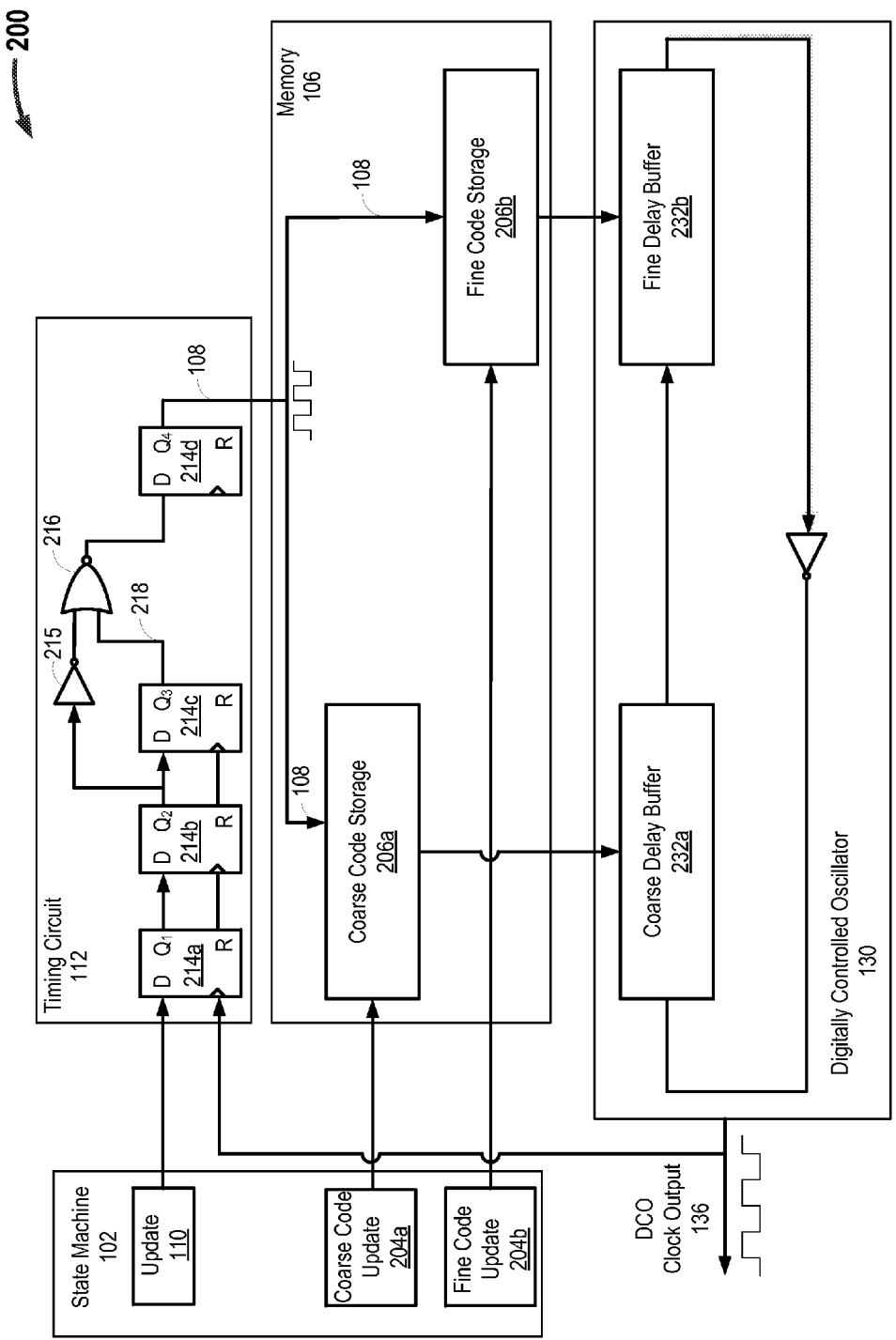
FIG. 2 illustrates an example system that includes code storage and delay buffers in addition to the state machine and timing circuit capable of providing a glitch-free digitally controlled oscillator (DCO) code update, in accordance with at least one embodiment of the present disclosure.

FIG. 2 illustrates an example glitch-free digitally controlled oscillator (DCO) update system 100 in which the state machine 102 provides a coarse code update 204a or a fine code update 204b (collectively "code updates 204") that are synchronously transferred to a DCO coarse delay buffer 232a or a DCO fine delay buffer 232b (collectively "delay buffers 232") using a pulsed update signal 110 synchronized to the pulsed DCO clock output signal 136, in accordance with one or more aspects of the present disclosure. As depicted in FIG. 2, the state machine 102 provides the coarse code update 204a and the fine code update 204b to the coarse code storage 206a and the fine code storage 206b, respectively (collectively "code storage 206").

The timing circuit 112 includes flip-flops 214a, 214b, 216, and 220. The timing circuit 112 aligns or synchronizes at least one pulse in the pulsed update signal 110 with the pulses in the pulsed DCO clock output 136. Flip-flop 220 provides the update enabled signal 108 to the code storage 206 upon alignment or synchronization of the pulsed update signal 110 with the DCO clock output 136.

The update enabled signal 108 is aligned or synchronized with either the leading edge or the trailing edge of a pulse in the pulsed DCO clock output signal 136. Upon receipt of the update enabled signal 108, the code storage 206 communicates the coarse code update 204a to the DCO coarse delay buffer 232a or the fine code update 204b to the DCO fine delay buffer 232b. By communicating the code updates 204 to the appropriate delay buffer 232 prior to a state change in the DCO output signal 136, the DCO code update is glitch-free.

At times, dependent at least in part on the detected drift in the DCO clock output signal 136 by the comparator 150, the state machine 102 can provide a coarse code update 204a that includes a relatively larger change (e.g., ±100 picoseconds) to the DCO delay chain. At times, again dependent at least in part on the detected drift in the DCO clock output signal 136 by the comparator 150, the state machine 102 can provide a fine code update 204b that includes a relatively smaller change (e.g., ±15 picoseconds) to the DCO delay chain.

The coarse code storage 206a and the fine code storage 206b may include any number of devices, components, systems, or combinations thereof capable of persistent or temporary storage or retention of the coarse code update 204a and the fine code update 204b received from the state machine 102. In embodiments, the code storage 206 may include any number or combination of storage devices, such as a number of latches, capable of persistent or transient storage or retention of at least one of the coarse code update 204a or the fine code update 204b prior to communicating the respective code update 204a, 204b to the coarse delay buffer 232a or the fine delay buffer 232b. In one embodiment, the memory 106 may include a number of gated D latches that are clocked or enabled by the update enabled signal 108. Thus, the code storage 206 may communicate the code updates 204 upon receipt of the update enabled signal 108 from the timing circuit 112.

The timing circuit 112 includes a number of logic devices that, in some instances, may include a number of flip-flops 214a-214d (collectively "flip-flops 214"). In embodiments, the flip-flops include D (i.e., "data" or "delay" type) flip-flops. The D flip-flop captures the value or logic state of the D input (e.g., the value of the update signal 110) at a definite portion of the pulsed DCO clock output signal 136 clock cycle (e.g., a rising edge of a logic state transition or a falling edge of a logic state transition in the pulsed clock output 136). That captured value or logic state then becomes the Q output. D flip-flops can be viewed as a memory cell, a zero-order hold, or a delay line.

As depicted in FIG. 2, the update signal 110 is provided to a first flip-flop 214a. When the update signal 110 is in a second logic state (e.g., a HIGH logic state), as the DCO clock output signal 136 transitions from a first logic state (e.g., a LOW logic state) to a second logic state (e.g., a HIGH logic state), the output $Q_1$ will be set to and remain in the same logic state (a HIGH logic state) as the update signal 110.

It is noted that, for consistency and clarity, the designators "first logic state" and "second logic state" have been selected to correspond, respectively, to LOW and HIGH logic states for illustrative purposes. Instances may occur where the first logic state corresponds to a logic state other than a LOW logic state and the second logic state corresponds to a logic state other than the HIGH logic state. Such instances are intended to fall within the scope of this disclosure.

The second flip-flop $Q_2$ 214b is serially coupled to the first flip-flop 214a and receives the $Q_1$ output from the first flip-flop 214a. When output $Q_1$ is in a HIGH logic state and the DCO clock output signal 136 transitions from the first logic state to the second logic state, the output $Q_2$ will be set to and remain in the same logic state as the $Q_1$ signal. Exiting the second flip-flop 214b, the $Q_2$ signal (i.e., the update signal 110) is synchronized to the DCO clock output signal 136.

The third flip-flop 214c is serially coupled to the second flip-flop 214b and receives the $Q_2$ output from the second flip-flop 214b. A NOT logic gate or inverter 215 is coupled in parallel with the third flip-flop 214c and also receives the $Q_2$ signal. When output $Q_2$ is in a HIGH logic state and the DCO clock output signal 136 transitions from the first logic state to the second logic state, the output $Q_3$ will be set to and remain in the same logic state as the $Q_2$ signal. The third flip-flop 214c provides a pulsed $Q_3$ signal having a pulse width similar to the period of the pulsed DCO clock output signal 136.

The $Q_3$ signal is combined with the output of the inverter 215 using a NOR logic gate 216. The output from the NOR logic gate 216 is in a second logic state (e.g., a HIGH logic state) only when the inverse of the $Q_2$ signal (i.e., the inverse of the update signal 110) and the $Q_3$ signal having a pulse width similar to the DCO clock period are both in a first logic state (e.g., a LOW logic state). At all other times, the output of the NOR logic gate 216 is in a first logic state (e.g., a LOW logic state).

The fourth flip-flop 214d receives the output of the NOR logic gate 216. When the output from the NOR logic gate 216 is in a HIGH logic state and the DCO clock output signal 136 transitions from the first logic state to the second logic state, the output $Q_4$ will be set to and remain in the same logic state as the output of the NOR logic gate 216. The output $Q_4$ from the fourth flip-flop 214d sharpens the update enabled signal 108 to a rising edge (e.g., a change from a LOW to a HIGH logic state) or a falling edge (e.g., a change from a HIGH to a LOW logic state) of a pulse in the DCO clock output signal 136. The update enabled signal 108 provided by the output $Q_4$ from the fourth flip-flop 214d causes the transfer of the code updates 204 in the code storage 206 to the buffers 232. In implementations where the code storage 206 includes a number of gated latches, the update enabled signal 108 (i.e., the $Q_4$ output provided by the fourth flip-flop 214d) causes the latches in the code storage 206 to transfer the code updates 204 to the delay buffers 232 in the DCO 130. DCO code updates 204 transfer from code storage 206 to the delay buffers 232, over an interval when the DCO delay chain is in the same logic state, thereby providing a glitch-free code update of the DCO clock output signal 136.

Figure 3:
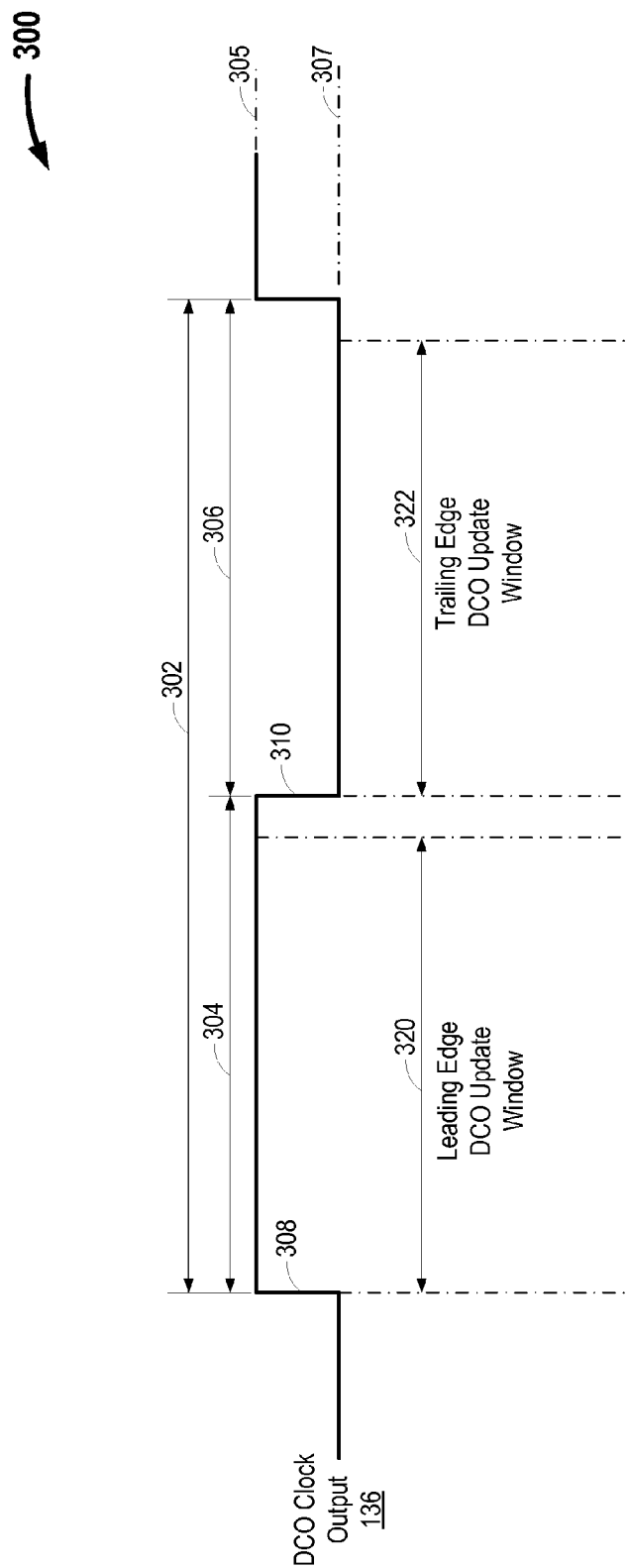
FIG. 3 illustrates an example timing diagram for an illustrative pulsed DCO clock output signal showing update leading edge and trailing edge windows for providing a DCO code update to a DCO, in accordance with at least one embodiment of the present disclosure.

FIG. 3 depicts a timing diagram 300 of the available windows in the DCO clock output signal 136 in which a glitch-free DCO code update may be achieved, in accordance with one or more aspects of the present disclosure. The pulsed DCO clock output signal 136 has a period 302 that includes a first interval 304 during which the DCO clock output signal 136 is in a second logic state 305 (e.g., the HIGH logic state) and a second interval 306 during which the DCO clock output signal 136 is in a first logic state 307 (e.g., the LOW logic state).

A leading edge DCO code update window 320 extends from the transition 308 of the DCO clock output signal from the first logic state 307 to the second logic state 305. The leading edge DCO code update window 320 extends for a portion of the first interval 304 during which the DCO clock output is in the second logic state 305. In embodiments, the leading edge DCO code update window 320 may extend for a maximum interval approximately equal to one coarse delay step in the DCO 130 (e.g., ±100 picoseconds). In embodiments, the leading edge DCO code update window 320 may extend for a maximum interval approximately equal to one-half of the DCO clock output period 302 less one fine delay step (e.g., ±15 picoseconds) in the DCO 130. Providing the DCO code update 204 to the delay buffer 232 over the interval defined by the leading edge DCO code update window 310 may permit the application of the DCO code update 204 while the DCO delay chain remains in a consistent logical state.

A trailing edge DCO code update window 322 extends from the transition 310 of the DCO clock output signal from the second logic state 305 to the first logic state 307. The trailing edge DCO code update window 322 extends for a portion of the second interval 306 during which the DCO clock output is in the first logic state 307. In embodiments, the trailing edge DCO code update window 322 may extend for a maximum interval approximately equal to one coarse delay step (e.g., ±100 picoseconds) in the DCO 130. In embodiments, the trailing edge DCO code update window 322 may extend for a maximum interval approximately equal to one-half of the DCO clock output period 302 less one fine delay step (e.g., ±15 picoseconds) in the DCO 130. Providing the DCO code update 204 to the delay buffer 232 over the interval defined by the trailing edge DCO code update window 322 may permit the application of the DCO code update 204 while the DCO delay chain remains in a consistent logical state.

Figure 4:
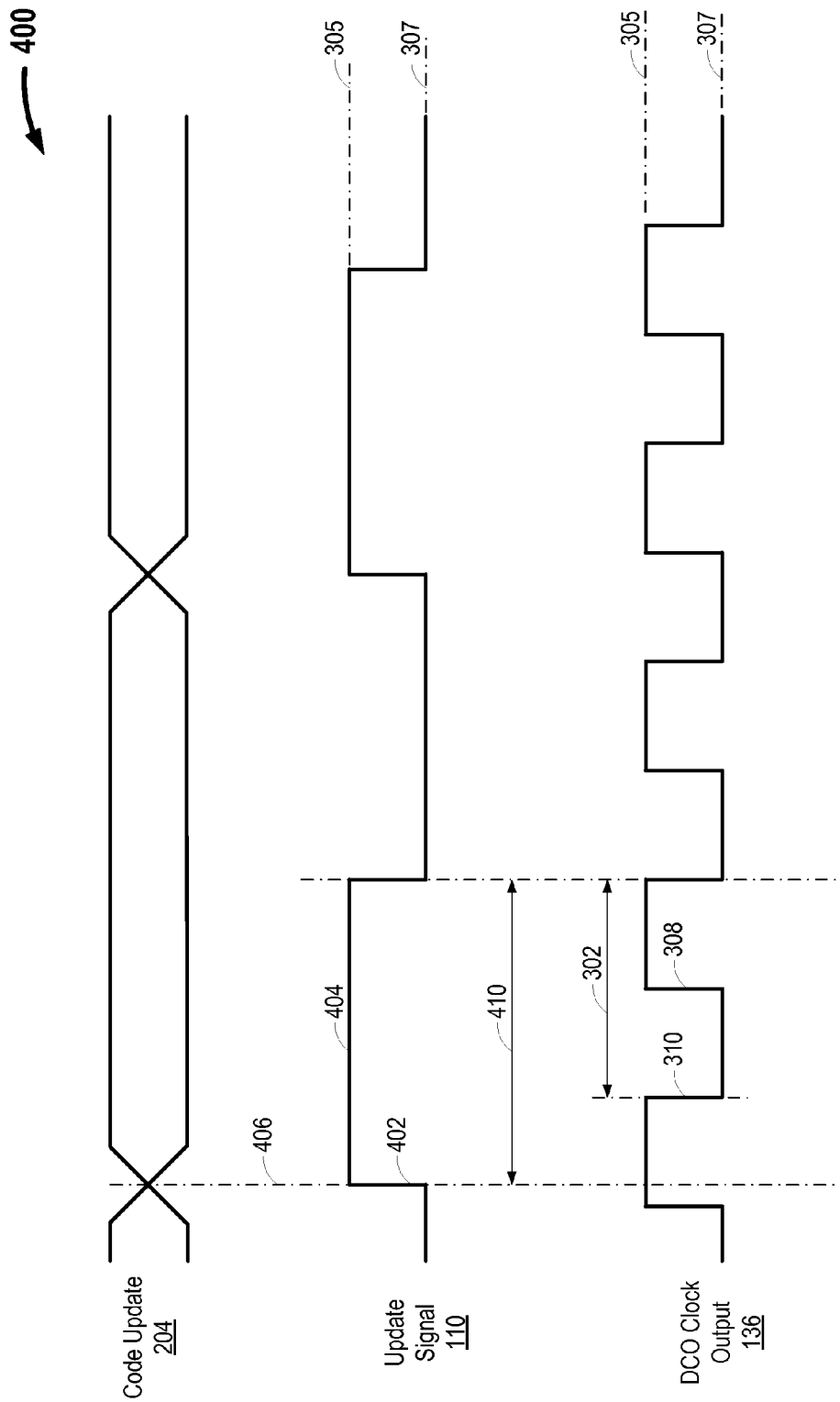
FIG. 4 illustrates an example timing diagram showing the temporal relationship between a DCO code update, a pulsed DCO update signal, and a pulsed DCO clock output, in accordance with at least one embodiment of the present disclosure.

FIG. 4 depicts a timing diagram 400 showing the temporal relationship between the DCO code update 204, the pulsed update signal 110, and the DCO clock output signal 136, in accordance with one or more aspects of the present disclosure. The state machine 102 generates and transmits the DCO code update 204 and the pulsed update signal 110 that includes at least one pulse 404. In embodiments, the state machine 110 may align 406 a logical state transition 402 (e.g., from a first logic state 307 to a second logic state 305) of the pulse 404 in the pulsed update signal 110 with the DCO code update 204. As depicted in FIG. 4, at times, the state machine 110 may align the DCO code update 204 with a transition 402 from a first logic state 307 to a second logic state 305 in the pulsed update signal 110. At other times, the state machine 110 may align the DCO code update 204 with a transition 402 from a second logic state 305 to a first logic state 307 in the pulsed update signal 110.

At times, the duration or pulse width of at least one of the pulses 404 in the pulsed update signal 110 may extend beyond the period 302 of the DCO clock output signal 136. Extending the duration or pulse width of at least one of the pulses 404 in the pulsed update signal 110 beyond the period 302 of the DCO clock output signal 136 may permit the timing circuit 112 to more easily detect or distinguish the transition 402 in the pulsed update signal 110 indicating an available DCO code update 204.

Figure 5:
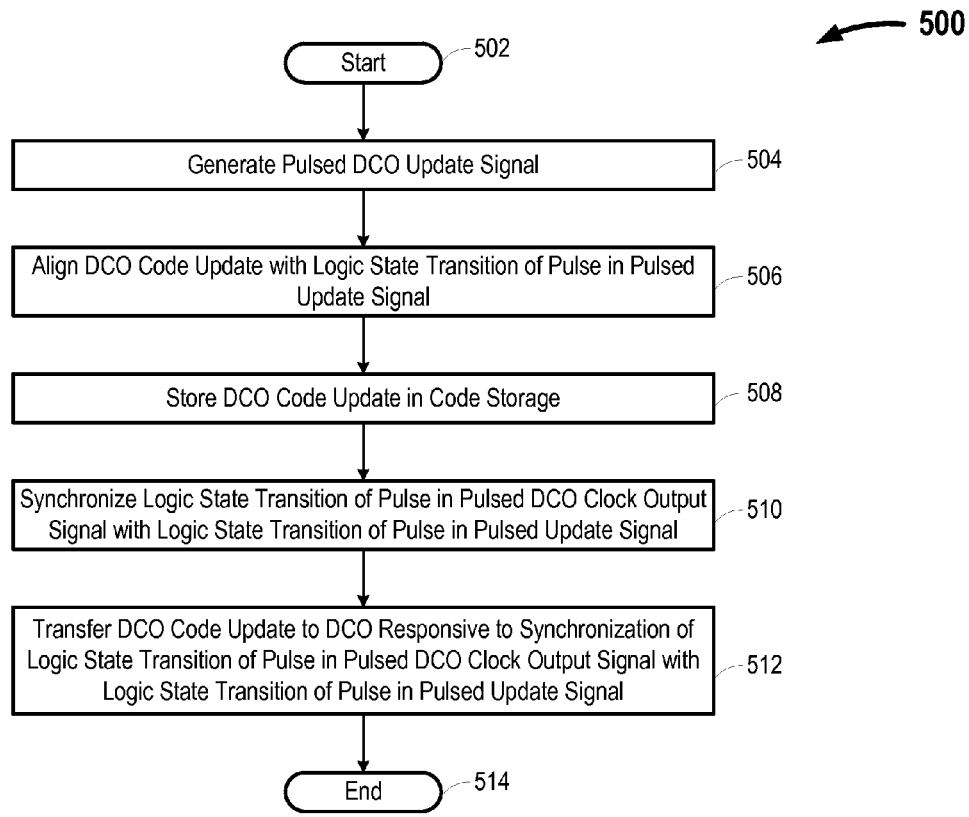
FIG. 5 illustrates an example method of providing a glitch-free DCO code update, in accordance with at least one embodiment of the present disclosure.

FIG. 5 depicts a high-level logic flow diagram of an illustrative method 500 of providing a glitch-free DCO code update 204 to a DCO 130, in accordance with one or more aspects of the present disclosure. The method 500 achieves glitch-free DCO code updates by synchronizing the transfer of the DCO code update 204 to the DCO 130 with a LOW to HIGH logic state transition 308 or a HIGH to LOW logic state transition 310 in the logic state of the DCO clock output signal 136. Such synchronization may permit the application of the DCO code update 204 while the DCO delay chain is in the same logical state. The method 500 commences at 502.

At 504, the state machine 102 generates the pulsed DCO update signal 110. At times, the pulsed DCO update signal 110 may contain a series of pulses 404 that alternate between a first logic state 307 and a second logic state 305. The series of pulses 404 contained in the pulsed DCO update signal 110 may be at a single frequency or at a plurality of frequencies. In embodiments, the duration that some or all of the pulses 404 remain in a single logic state (e.g., the first logic state 307) may be greater than the period 302 of the pulses included in the DCO clock output 136.

At 506, the state machine 102 aligns the DCO code update 204 with a logic state transition in the DCO update signal 110. For example, the state machine 102 may align the DCO code update 204 with a LOW to HIGH logic state transition 402 in the DCO update signal 110.

At 508, the DCO code update is stored in the code storage 206. In embodiments, a coarse DCO code update 204a may be stored in the coarse code storage 206a. In embodiments, a fine DCO code update 204b may be stored in the fine code storage 206b. At times, the code storage 206 may include a number of latches to store the code updates 204 received from the state machine 102.

At 510, the timing circuit 112 synchronizes a logic state transition 402 in the pulsed DCO update signal 110 with a LOW to HIGH logic state transition 308 or a HIGH to LOW logic state transition 310 in the logic state of the DCO clock output signal 136.

At 512, responsive to the synchronization of the logic state transition 402 in the pulsed DCO update signal 110 with a LOW to HIGH logic state transition 308 or a HIGH to LOW logic state transition 310 in the logic state of the DCO clock output signal 136 at 510, the DCO code update 204 is transferred to the DCO 130. In embodiments, a coarse DCO code update 204a is transferred from coarse code storage 206a to the coarse delay buffers 232a. In embodiments, a fine DCO code update 204b is transferred from the fine code storage 206b to the fine delay buffers 232b. The method 500 concludes at 514.

Figure 6:
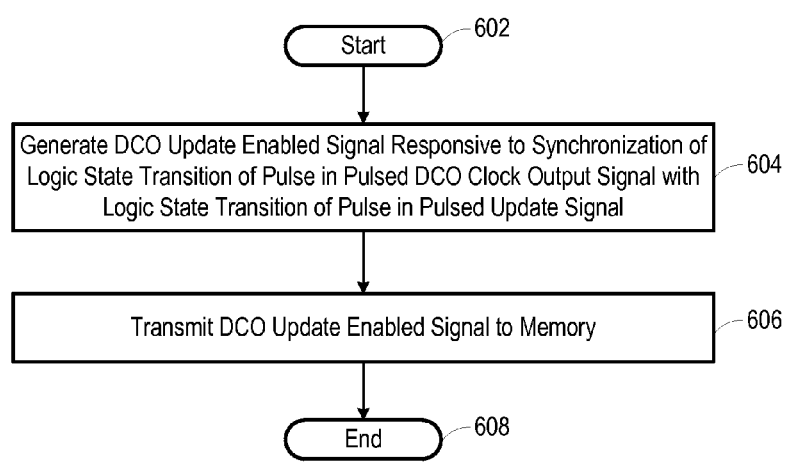
FIG. 6 illustrates an example method of providing a glitch-free DCO code update.

FIG. 6 depicts a high-level logic flow diagram of an illustrative method 600 of providing a glitch-free DCO code update 204 to a DCO 130, in accordance with one or more aspects of the present disclosure. In embodiments, some or all of the method 600 may be incorporated into method 500 discussed in detail above. At times, the timing circuit 112 may generate a DCO update enabled signal 108 that triggers the transfer of the DCO code updates 204 from the code storage 206 to the delay buffers 232. In embodiments, the DCO update enabled signal 108 includes at least one pulse. In such embodiments, the transition in logic state of the DCO update enabled signal 108 causes the transfer of the DCO code updates 204 from the code storage 206 to the delay buffers 232. The method 600 commences at 602.

At 604, the timing circuit 112 generates the DCO update enabled signal 108 responsive to the synchronization of the logic state transition 402 in the pulsed DCO update signal 110 with a LOW to HIGH logic state transition 308 or a HIGH to LOW logic state transition 310 in the logic state of the DCO clock output signal 136. In embodiments, the synchronization of the logic state transition 402 in the pulsed DCO update signal 110 with a LOW to HIGH logic state transition 308 or a HIGH to LOW logic state transition 310 in the logic state of the DCO clock output signal 136 may be as discussed above in the method 500, at 510.

At 606, the DCO code update 204 retained in code storage 206 is transferred to the delay buffers 232 in the DCO. In some implementations, the transfer of the DCO code update 204 is initiated by the change in logic state of the DCO update enabled signal 108. In embodiments, the transfer of the DCO code update 204 from code storage 106 to the delay buffers 232 may be completed within the interval defined by the leading edge DCO update window 320 or within the interval defined by the trailing edge DCO update window 322. The method 600 concludes at 608.

The following examples pertain to further embodiments. The following examples of the present disclosure may comprise subject material such as a device, a method, at least one machine-readable medium for storing instructions that when executed cause a machine to perform acts based on the method, means for performing acts based on the method and/or a system for binding a trusted input session to a trusted output session to prevent the reuse of encrypted data obtained from prior trusted output sessions.

According to example 1, there is provided a system for synchronizing digitally controlled oscillator (DCO) code updates to a DCO clock output signal. The system can include a DCO to provide a pulsed clock output, at least one storage device to receive a DCO code update, the at least one storage device communicably coupled to the DCO; and at least one timing circuit communicably coupled to the at least one storage device and to the DCO. The at least one timing circuit aligns a logic state transition in a pulse in the pulsed DCO clock output with a logic state transition of a pulse in a pulsed update signal received with the DCO code update; and causes a transfer of the DCO code update from the at least one storage device to the DCO responsive to an alignment of the logic state transition in the pulse of the pulsed DCO clock output with the logic state transition of the pulse in the pulsed update signal.

Example 2 may include elements of example 1 and may additionally include a state machine to provide the pulsed update signal and the DCO code update. The DCO code update may be aligned with the logic state transition of the pulse in the update signal.

Example 3 may include elements of example 2 and the at least one timing circuit may generate a DCO update enabled signal that includes at least one pulse, the at least one pulse of the DCO update enabled signal aligned with one of: a leading edge of the pulse in the pulsed DCO clock output signal or a trailing edge of the pulse in the pulsed DCO clock output signal.

Example 4 may include elements of example 3 and the at least one timing circuit may include a plurality of cascaded flip-flops.

Example 5 may include elements of example 4 and the at least one timing circuit may include a first pair of flip-flops to align the logic state transition in the pulse in the pulsed DCO clock output with the logic state transition of the pulse in the update signal received with the DCO code update.

Example 6 may include elements of example 5 and the timing circuit may include a second pair of D flip-flops to generate the DCO update enabled signal.

Example 7 may include elements of example 6 and the pulse width of the at least one pulse included in the pulsed update signal is at least equal to a period of the pulsed DCO clock output signal.

According to example 8, there is provided a method for updating a digitally controlled oscillator (DCO). The method may include generating, by a state machine, a pulsed update signal. The method may further include aligning, by the state machine, a DCO code update with a logic state transition of a pulse in the pulsed update signal. The method may further include storing the DCO code update in a memory communicably coupled to the state machine. The method may further include synchronizing, by a timing circuit, a logic state transition of a pulsed DCO clock output signal with the logic state transition of the pulse in the pulsed update signal. The method additionally includes transferring the DCO code update from the memory to the DCO responsive to the synchronization of the logic state transition of a pulse in the pulsed DCO clock output signal with the logic state transition of the pulse in the pulsed update signal.

Example 9 may include elements of example 8 and transferring the DCO code update from the memory to the DCO responsive to the synchronization of the logic state transition of a pulse in the pulsed DCO clock output signal with the logic state transition of the pulse in the pulsed update signal may include generating, by the timing circuit, a DCO update enabled signal responsive to the synchronization of the logic state transition of the pulse in the pulsed DCO clock output signal with the logic state transition of the pulse in the pulsed update signal and transmitting the DCO update enabled signal to the memory.

Example 10 may include elements of example 9 and synchronizing a logic state transition of a pulse in the pulsed DCO clock output signal with the logic state transition of the pulse in the pulsed DCO update signal may include synchronizing the logic state transition of the pulse in the pulsed DCO clock output signal with the logic state transition of the pulse in the pulsed update signal by a timing circuit that includes a plurality of serially cascaded flip-flops.

Example 11 may include elements of example 10 and synchronizing the logic state transition of the pulse in the DCO clock output signal with the logic state transition of the pulse in the pulsed update signal may include synchronizing the logic state transition of the pulse in the DCO clock output signal with the logic state transition of the pulse in the pulsed update signal by a timing circuit that includes a first pair of serially cascaded D flip-flops.

Example 12 may include elements of example 11 and generating, by the timing circuit, a DCO update enabled signal may include generating the DCO update enabled signal by a timing circuit that includes a second pair of serially cascaded D flip-flops, the second pair of serially cascaded D flip-flops coupled in series with the first pair of serially cascaded D flip-flops.

Example 13 may include elements of example 9 and generating a DCO update enabled signal responsive to the synchronization of the logic state transition of a pulse in the pulsed DCO clock output signal with the logic state transition of the pulse in the pulsed update signal may include generating, by the timing circuit, a DCO update enabled signal that includes at least one pulse having a width at least equal to a period of the pulsed DCO clock output signal.

Example 14 may include elements of example 13 and generating, by the timing circuit, a DCO update enabled signal that includes a pulse having a width at least equal to the defined period of the pulse in the pulsed DCO clock output signal may include aligning, by the timing circuit, the at least one pulse in the DCO update enabled signal with one of: a leading edge of a pulse in the pulsed DCO clock output signal or a trailing edge of a pulse in the pulsed DCO clock output signal.

According to example 15, there is provided a machine-readable medium comprising one or more instructions that when executed by a processor cause the processor to cause a state machine communicably coupled to a digitally controlled oscillator (DCO) to generate a pulsed update signal. The instructions further cause the at least one processor to cause the state machine to align a DCO code update with a logic state transition of a pulse in the pulsed update signal. The instructions may also cause the at least one processor to store the DCO code update in a memory communicably coupled to the state machine and transfer the DCO code update from the memory to the DCO responsive to the synchronization of the logic state transition of a pulse in the pulsed DCO clock output signal with the logic state transition of the pulse in the pulsed update signal.

Example 16 may include elements of example 15 and the machine readable instructions that cause the at least one processor to transfer the DCO code update from the memory to the DCO responsive to the synchronization of the logic state transition of a pulse in the pulsed DCO clock output signal with the logic state transition of the pulse in the pulsed update signal further cause the at least one processor to transfer the DCO code update from the memory to the DCO responsive to the receipt of a DCO update enabled signal generated by a timing circuit responsive to the synchronization of the logic state transition of a pulse in the pulsed DCO clock output signal with the logic state transition of the pulse in the pulsed update signal Example 17 may include elements of example 16 and the machine readable instructions that cause the at least one processor to transfer the DCO code update from the memory to the DCO responsive to the receipt of a DCO update enabled signal generated by a timing circuit responsive to the synchronization of the logic state transition of a pulse in the pulsed DCO clock output signal with the logic state transition of the pulse in the pulsed update signal further cause the at least one processor to transfer the DCO code update from the memory to the DCO responsive to the receipt of a DCO update enabled signal that includes at least one pulse having a width at least equal to the defined period of a pulse in the pulsed DCO clock output signal.

Example 18 may include elements of example 17 and the machine readable instructions that cause the at least one processor to transfer the DCO code update from the memory to the DCO responsive to the receipt of a DCO update enabled signal that includes a pulse having a width at least equal to the defined period of a pulse in the pulsed DCO clock output signal further cause the at least one processor to cause the timing circuit to align the at least one pulse in the DCO update enabled signal with one of: a leading edge of a pulse in the pulsed DCO clock output signal or a trailing edge of a pulse in the pulsed DCO clock output signal.

According to example 19, there is provided a system for glitch-free transfer of digitally controlled oscillator (DCO) code updates to a DCO. The system may include a means for generating a pulsed DCO update signal. The system may additionally include a means for aligning a DCO code update with a logic state transition of a pulse in the pulsed DCO update signal. The system may also include a means for storing the DCO code update. The system may also include a means for synchronizing a logic state transition of a pulsed DCO clock output signal with the logic state transition of the pulse in the pulsed DCO update signal. The system may include a means for transferring the DCO code update to the DCO responsive to the synchronization of the logic state transition of a pulse in the pulsed DCO clock output signal with the logic state transition of the pulse in the pulsed DCO update signal.

Example 20 may include elements of example 19 and the means for transferring the DCO code update from the memory to the DCO responsive to the synchronization of the logic state transition of a pulse in the pulsed DCO clock output signal with the logic state transition of the pulse in the pulsed DCO update signal further comprises a means for generating a DCO update enabled signal responsive to the synchronization of the logic state transition of the pulse in the pulsed DCO clock output signal with the logic state transition of the pulse in the pulsed DCO update signal; and a means for transmitting the DCO update enabled signal responsive to generating the DCO update enabled signal.

According to example 21, there is provided an apparatus for glitch-free transfer of digitally controlled oscillator (DCO) code updates to a DCO. The apparatus may include a state machine to generate a DCO code update and a pulsed DCO update signal and align the DCO code update with a leading edge of a pulse in the pulsed DCO update signal. The apparatus may additionally include a timing circuit to receive the pulsed DCO update signal from the state machine, receive a pulsed DCO clock output signal from a DCO, align the leading edge of the pulsed DCO update signal with a leading edge of a pulse in the pulsed DCO clock output signal, and generate a DCO update enabled signal having at least one pulse aligned with at least one of the leading edge or the trailing edge of a pulse in the pulsed DCO clock output, the DCO update enabled signal to cause a transfer for the DCO code update to the DCO.

Example 22 may include elements of example 21, and may additionally include at least one code storage circuit to receive the DCO code update from the state machine, receive the DCO update enabled signal and transfer the DCO code update to the DCO upon receipt of the DCO update enabled signal.

Example 23 may include elements of example 21 and the timing circuit may include a first pair of serially coupled flip-flops, the first pair of serially coupled flip-flops to align the leading edge of the pulsed DCO update signal with a leading edge of a pulse in the pulsed DCO clock output signal.

Example 24 may include elements of example 23 and the timing circuit comprises a second pair of serially coupled flip-flops, the second pair of serially coupled flip-flops to generate the DCO update enabled signal, including at least one pulse having a width at least equal to the width of a period of the pulsed DCO clock output; and align a leading edge of the at least one pulse in the DCO update signal with at least one of the leading edge or the trailing edge of a pulse in the pulsed DCO clock output.

Example 25 may include elements of example 22 and the state machine to generate at least one of a coarse DCO code update or a fine DCO code update.

Example 26 may include elements of example 25 and the at least one code storage circuit to receive at least one of the coarse DCO code update or the fine DCO code update from the state machine.

Example 27 may include elements of example 25 and the at least one code storage circuit to further, upon receipt of the DCO update enabled signal: transfer at least one of the coarse DCO code update to a coarse code buffer in the DCO or the fine DCO code update to a fine code buffer in the DCO.

According to example 28, there is provided a system for glitch-free transfer of digitally controlled oscillator (DCO) code updates to a DCO including at least a device, the system being arranged to perform the method of any of examples 8 to 14.

According to example 29, there is provided a chipset arranged to perform the method of any of examples 8 to 14.

According to example 30, there is provided at least one machine readable medium comprising a plurality of instructions that, in response to be being executed on a computing device, cause the computing device to carry out the method according to any of examples 8 to 14.

According to example 31, there is provided a device configured for glitch-free transfer of digitally controlled oscillator (DCO) code updates to a DCO, the device being arranged to perform the method of any of examples 8 to 14.

According to example 32, there is provided a method of providing a glitch-free transfer of digitally controlled oscillator (DCO) code updates to a DCO. The method can include aligning a leading edge of a pulse in a pulsed DCO update signal with a DCO code update. The method may include aligning the leading edge of the pulse in the pulsed DCO update signal with a leading edge of a pulse in a pulsed DCO clock output signal. The method may include generating a DCO update enabled signal that includes at least one pulse responsive to aligning the leading edge of the pulse in the pulsed DCO update signal with the leading edge of the pulse in the pulsed DCO clock output signal. The method may also include causing a transfer of the DCO code update to the DCO over an interval where a DCO delay chain maintains a fixed logical state.

Example 33 may include elements of example 32 and causing a transfer of the DCO code update to the DCO over an interval where a DCO delay chain maintains a fixed logical state may include synchronizing a leading edge of the DCO update enabled signal with at least one of the leading edge of the pulse in the pulsed DCO clock signal or a trailing edge of the pulse in the pulsed DCO clock signal; and transferring the DCO code update to a DCO over an interval that is less than at least one of: one coarse delay step or one-half of the period of the pulsed DCO clock output signal less one fine delay step.

According to example 34, there is provided a system for glitch-free transfer of digitally controlled oscillator (DCO)

code updates to a DCO including at least a device, the system being arranged to perform the method of any of examples 32 or 33.

According to example 35, there is provided a chipset arranged to perform the method of any of examples 32 or 33.

According to example 36, there is provided at least one machine readable medium comprising a plurality of instructions that, in response to be being executed on a computing device, cause the computing device to carry out the method according to any of examples 32 or 33.

According to example 37, there is provided a device configured for glitch-free transfer of digitally controlled oscillator (DCO) code updates to a DCO, the device being arranged to perform the method of any of examples 32 or 33.

According to example 38, there is provided a system for providing a glitch-free transfer of digitally controlled oscillator (DCO) code updates to a DCO. The system includes a means for aligning a leading edge of a pulse in a pulsed DCO update signal with a DCO code update. The system also includes a means for aligning the leading edge of the pulse in the pulsed DCO update signal with a leading edge of a pulse in a pulsed DCO clock output signal. The system also includes a means for generating a DCO update enabled signal that includes at least one pulse responsive to aligning the leading edge of the pulse in the pulsed DCO update signal with the leading edge of the pulse in the pulsed DCO clock output signal. The system also includes a means for causing a transfer of the DCO code update to the DCO over an interval where a DCO delay chain maintains a fixed logical state.

Example 39 may include elements of example 38 and the means for causing a transfer of the DCO code update to the DCO over an interval where a DCO delay chain maintains a fixed logical state may include a means for synchronizing a leading edge of the DCO update enabled signal with at least one of the leading edge of the pulse in the pulsed DCO clock signal or a trailing edge of the pulse in the pulsed DCO clock signal; and a means for transferring the DCO code update to a DCO over an interval that is less than at least one of: one coarse delay step or one-half of the period of the pulsed DCO clock output signal less one fine delay step.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A system for synchronizing digitally controlled oscillator (DCO) code updates, the system comprising:
   at least one storage device to receive a DCO code update, the at least one storage device communicably coupled to a DCO; and
   at least one timing circuit communicably coupled to the at least one storage device and to the DCO, the at least one timing circuit to:
      align a logic state transition in a pulse in a pulsed clock output provided by the DCO with a logic state transition of a pulse in a pulsed update signal received with the DCO code update; and
      cause a transfer of the DCO code update from the at least one storage device to the DCO responsive to an alignment of the logic state transition in the pulse of the pulsed DCO clock output with the logic state transition of the pulse in the pulsed update signal.

2. The system of claim 1, further comprising:
   a state machine to provide the pulsed update signal and the DCO code update;
   wherein the DCO code update is aligned with the logic state transition of the pulse in the update signal.

3. The system of claim 2 wherein the at least one timing circuit generates a DCO update enabled signal that includes at least one pulse, the at least one pulse of the DCO update enabled signal aligned with one of: a leading edge of the pulse in the pulsed DCO clock output signal or a trailing edge of the pulse in the pulsed DCO clock output signal.

4. The system of claim 3 wherein the at least one timing circuit comprises a plurality of cascaded flip-flops.

5. The system of claim 4 wherein the at least one timing circuit comprises a first pair of flip-flops to align the logic state transition in the pulse in the pulsed DCO clock output with the logic state transition of the pulse in the update signal received with the DCO code update.

6. The system of claim 5 wherein the timing circuit comprises a second pair of D flip-flops to generate the DCO update enabled signal.

7. The system of claim 1 wherein the pulse width of the at least one pulse included in the pulsed update signal is at least equal to a period of the pulsed DCO clock output signal.

8. A method for updating a digitally controlled oscillator (DCO), the method comprising:
   generating, by a state machine, a pulsed update signal;
   aligning, by the state machine, a DCO code update with a logic state transition of a pulse in the pulsed update signal;
   storing the DCO code update in a memory communicably coupled to the state machine;
   synchronizing, by a timing circuit, a logic state transition of a pulsed DCO clock output signal with the logic state transition of the pulse in the pulsed update signal; and
   transferring the DCO code update from the memory to the DCO responsive to the synchronization of the logic state transition of a pulse in the pulsed DCO clock output signal with the logic state transition of the pulse in the pulsed update signal.

9. The method of claim 8 wherein transferring the DCO code update from the memory to the DCO responsive to the synchronization of the logic state transition of a pulse in the pulsed DCO clock output signal with the logic state transition of the pulse in the pulsed update signal comprises:
   generating, by the timing circuit, a DCO update enabled signal responsive to the synchronization of the logic state transition of the pulse in the pulsed DCO clock output signal with the logic state transition of the pulse in the pulsed update signal; and
   transmitting the DCO update enabled signal to the memory.

10. The method of claim 9 wherein synchronizing a logic state transition of a pulse in the pulsed DCO clock output signal with the logic state transition of the pulse in the pulsed update signal comprises:
    synchronizing the logic state transition of the pulse in the pulsed DCO clock output signal with the logic state transition of the pulse in the pulsed update signal by a timing circuit that includes a plurality of serially cascaded flip-flops.

11. The method of claim 10 wherein synchronizing the logic state transition of the pulse in the DCO clock output signal with the logic state transition of the pulse in the pulsed update signal comprises:

synchronizing the logic state transition of the pulse in the DCO clock output signal with the logic state transition of the pulse in the pulsed update signal by a timing circuit that includes a first pair of serially cascaded D flip-flops.

12. The method of claim 11 wherein generating, by the timing circuit, a DCO update enabled signal comprises:
generating the DCO update enabled signal by a timing circuit that includes a second pair of serially cascaded D flip-flops, the second pair of serially cascaded D flip-flops coupled in series with the first pair of serially cascaded D flip-flops.

13. The method of claim 9 wherein generating a DCO update enabled signal responsive to the synchronization of the logic state transition of a pulse in the pulsed DCO clock output signal with the logic state transition of the pulse in the pulsed update signal comprises:
generating, by the timing circuit, a DCO update enabled signal that includes at least one pulse having a width at least equal to the defined period of the pulse in the pulsed DCO clock output signal.

14. The method of claim 13 wherein generating, by the timing circuit, a DCO update enabled signal that includes a pulse having a width at least equal to the defined period of the pulse in the pulsed DCO clock output signal comprises:
aligning, by the timing circuit, the at least one pulse in the DCO update enabled signal with one of: a leading edge of a pulse in the pulsed DCO clock output signal or a trailing edge of a pulse in the pulsed DCO clock output signal.

15. A non-transitory machine-readable medium comprising machine readable instructions that, when executed:
cause a state machine communicably coupled to a digitally controlled oscillator (DCO) to generate a pulsed update signal;
cause the state machine to align a DCO code update with a logic state transition of a pulse in the pulsed update signal;
cause the state machine to store the DCO code update in a memory communicably coupled to the state machine;
cause the state machine to transfer the DCO code update from the memory to the DCO responsive to the synchronization of the logic state transition of a pulse in the pulsed DCO clock output signal with the logic state transition of the pulse in the pulsed update signal.

16. The non-transitory machine readable medium of claim 15 wherein the machine readable instructions that cause the state machine to transfer the DCO code update from the memory to the DCO responsive to the synchronization of the logic state transition of a pulse in the pulsed DCO clock output signal with the logic state transition of the pulse in the pulsed update signal further:
cause the state machine to transfer the DCO code update from the memory to the DCO responsive to the receipt of a DCO update enabled signal generated by a timing circuit responsive to the synchronization of the logic state transition of a pulse in the pulsed DCO clock output signal with the logic state transition of the pulse in the pulsed update signal.

17. The non-transitory machine readable medium of claim 16 wherein the machine readable instructions that cause the state machine to transfer the DCO code update from the memory to the DCO responsive to the receipt of a DCO update enabled signal generated by a timing circuit responsive to the synchronization of the logic state transition of a pulse in the pulsed DCO clock output signal with the logic state transition of the pulse in the pulsed update signal further:
cause the state machine to transfer the DCO code update from the memory to the DCO responsive to the receipt of a DCO update enabled signal that includes at least one pulse having a width at least equal to the defined period of a pulse in the pulsed DCO clock output signal.

18. The non-transitory machine readable medium of claim 17 wherein the machine readable instructions that cause the state machine to transfer the DCO code update from the memory to the DCO responsive to the receipt of a DCO update enabled signal that includes a pulse having a width at least equal to the defined period of a pulse in the pulsed DCO clock output signal further:
cause a timing circuit to align the at least one pulse in the DCO update enabled signal with one of: a leading edge of a pulse in the pulsed DCO clock output signal or a trailing edge of a pulse in the pulsed DCO clock output signal.

19. A system for synchronizing digitally controlled oscillator (DCO) control code updates, the system comprising:
a means for generating a pulsed DCO update signal;
a means for aligning a DCO code update with a logic state transition of a pulse in the pulsed DCO update signal;
a means for storing the DCO code update;
a means for synchronizing a logic state transition of a pulsed DCO clock output signal with the logic state transition of the pulse in the pulsed DCO update signal; and
a means for transferring the DCO code update to the DCO responsive to the synchronization of the logic state transition of a pulse in the pulsed DCO clock output signal with the logic state transition of the pulse in the pulsed DCO update signal.

20. The system of claim 19 wherein the means for transferring the DCO code update from the memory to the DCO responsive to the synchronization of the logic state transition of a pulse in the pulsed DCO clock output signal with the logic state transition of the pulse in the pulsed DCO update signal further comprises:
a means for generating a DCO update enabled signal responsive to the synchronization of the logic state transition of the pulse in the pulsed DCO clock output signal with the logic state transition of the pulse in the pulsed DCO update signal; and
a means for transmitting the DCO update enabled signal responsive to generating the DCO update enabled signal.

* * * * *